United States Patent
Ahmed et al.

(10) Patent No.: US 10,680,115 B2
(45) Date of Patent: Jun. 9, 2020

(54) P-CHANNEL OXIDE SEMICONDUCTOR THIN FILM TRANSISTOR

(71) Applicant: Intel Corporation, Santa Clara, CA (US)

(72) Inventors: Khaled Ahmed, Anaheim, CA (US); Prashant Majhi, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/772,762

(22) PCT Filed: Dec. 22, 2015

(86) PCT No.: PCT/US2015/067233
§ 371 (c)(1),
(2) Date: May 1, 2018

(87) PCT Pub. No.: WO2017/111929
PCT Pub. Date: Jun. 29, 2017

(65) Prior Publication Data
US 2018/0331227 A1    Nov. 15, 2018

(51) Int. Cl.
*H01L 29/12* (2006.01)
*H01L 29/786* (2006.01)
(Continued)

(52) U.S. Cl.
CPC ........ *H01L 29/7869* (2013.01); *H01L 27/124* (2013.01); *H01L 27/1218* (2013.01);
(Continued)

(58) Field of Classification Search
CPC ............... H01L 29/7869; H01L 27/124; H01L 27/1218; H01L 29/78615; H01L 29/66969;
(Continued)

(56) References Cited

U.S. PATENT DOCUMENTS

2004/0173788 A1* 9/2004 Takizawa ............ H01L 29/2003
                                              257/12
2007/0269599 A1* 11/2007 Meyer .................... C23C 14/06
                                              427/255.18
(Continued)

FOREIGN PATENT DOCUMENTS

CN    105224845    * 9/2015 ......... G06K 9/00006
WO    2017111929 A1    6/2017

OTHER PUBLICATIONS

Kim et al., Effects of sulfur substitution in amorphous InGaZnO4: optical properties and first-principles calculations, Feb. 14, 2015, The Ceramic Society of Japan, 537-541 (Year: 2015).*
(Continued)

*Primary Examiner* — Steven H Loke
*Assistant Examiner* — Samuel Park
(74) *Attorney, Agent, or Firm* — Patent Capital Group

(57) ABSTRACT

Substrates, assemblies, and techniques for enabling a p-channel oxide semiconductor. For example, some embodiments can include an oxide semiconductor, where the oxide semiconductor includes an indium gallium zinc oxide (IGZO) sulfur alloy as a semiconducting material. The semiconducting material can be included in a thin-film-transistor that includes one or more p-channels.

20 Claims, 5 Drawing Sheets

(51) Int. Cl.
*H01L 29/66* (2006.01)
*H01L 27/12* (2006.01)
(52) U.S. Cl.
CPC .. *H01L 29/66742* (2013.01); *H01L 29/66969* (2013.01); *H01L 29/78603* (2013.01); *H01L 29/78615* (2013.01); *H01L 29/78618* (2013.01)
(58) Field of Classification Search
CPC ......... H01L 29/78618; H01L 29/66742; H01L 29/78603
See application file for complete search history.

(56) References Cited

U.S. PATENT DOCUMENTS

| | | | |
|---|---|---|---|
| 2008/0251780 A1* | 10/2008 | Li | B82Y 10/00 257/13 |
| 2010/0044702 A1* | 2/2010 | Urayama | H01L 29/7869 257/43 |
| 2013/0320328 A1 | 12/2013 | Lee et al. | |
| 2014/0054442 A1* | 2/2014 | Huang | H01L 31/02 250/200 |
| 2014/0175399 A1* | 6/2014 | Choi | H01L 51/56 257/40 |
| 2014/0273333 A1* | 9/2014 | Liang | H01L 31/02246 438/85 |
| 2014/0273341 A1* | 9/2014 | Van Duren | H01L 21/30604 438/104 |
| 2014/0334596 A1 | 11/2014 | Kimura et al. | |
| 2015/0144942 A1 | 5/2015 | Yang et al. | |
| 2015/0179773 A1 | 6/2015 | Ahmed | |
| 2018/0165534 A1* | 6/2018 | Gao | G06K 9/00006 |

OTHER PUBLICATIONS

Kim, Junghwan et al., "Effects of sulfur substitution in amorphous InGaZnO4: optical properties and first-principles calculations", Journal of the Ceramic Society of Japan, Jul. 2015, vol. 123, No. 1439, pp. 537-541.
PCT International Preliminary Report on Patentability from International Application No. PCT/US2015/067233 dated Jul. 5, 2018; 9 pages.
PCT International Search Report and Written Opinion issued in PCT Application No. PCT/US2015/067233 dated Sep. 20, 2016; 10 pages.

* cited by examiner

P-CHANNEL OXIDE SEMICONDUCTOR THIN FILM TRANSISTOR

CROSS-REFERENCE TO RELATED APPLICATIONS

This Application is a national stage application under 35 U.S.C. § 371 of PCT Application PCT/US2015/067233, filed Dec. 22, 2015, and entitled "P-CHANNEL OXIDE SEMICONDUCTOR THIN FILM TRANSISTOR," which is hereby incorporated by reference in its entirety.

TECHNICAL FIELD

The present disclosure relates generally to the field of integrated circuits, and more particularly, to substrates, assemblies, and techniques to enable a p-channel oxide semiconductor thin film transistor.

BACKGROUND

As CMOS technology is scaled down, the power supply voltage typically drops to below 1V for low power consumption. However, many devices such as car electronics, displays, home electronics, etc. still need high voltage operation. Thus, it becomes important to have on-chip bridging input/outputs (I/Os) between high and low voltage devices for microprocessor and memory units.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

Figure 1A:
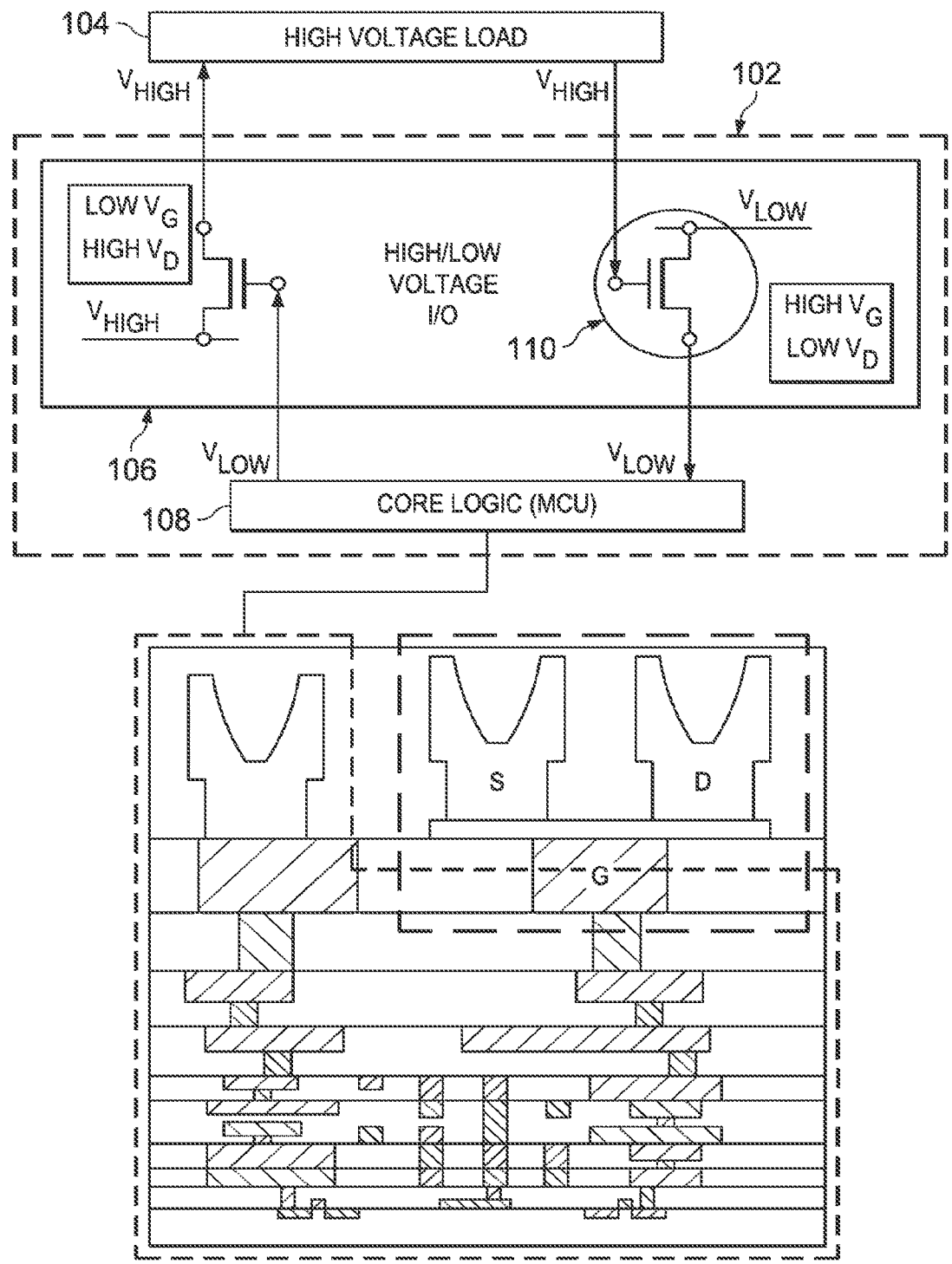
FIG. 1A is a simplified block diagram illustrating an embodiment of an electronic device, in accordance with one embodiment of the present disclosure.

The figures of the drawings are not necessarily drawn to scale, as their dimensions can be varied considerably without departing from the scope of the present disclosure.

DETAILED DESCRIPTION

Described herein are systems and methods that include an oxide semiconductor. In one example, a p-channel transistor can include an IGZO sulfur alloy. In another example, a process for making a p-channel IGZO TFT can include doping the IGZO with sulfur (or alloying sulfur with IGZO) to raise the valence band edge of IGZO. Raising the valence band can cause the traps near the valence band edge to be inside the valence band and thus allowing p-channel operation. Raising the valence band edge of IGZO will result in significant reduction of acceptor ionization energy of p-type dopants such as As, N, P, etc.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the embodiments disclosed herein may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. As used herein, the terms "chip" and "die" may be used interchangeably.

As CMOS technology is scaled down, the power supply voltage typically drops to below one volt (1V) for low power consumption. Many devices such as car electronics, displays and home electronics, however, still need high voltage operation. Thus, it becomes important to have on-chip bridging input/outputs (I/Os) between high and low voltage devices for microprocessor and memory units (e.g., system on a chip (SoC)).

A possible solution is to integrate I/O complementary metal-oxide semiconductor (CMOS) devices monolithically between metallization levels (e.g., metal 8 and metal 9 interconnect levels) using CMOS circuits made of thin film transistors (TFTs) that can be fabricated at temperatures below about three hundred degrees Celsius (300 C). The TFT CMOS circuits can provide a compact and cost effective integration of the state-of-the-art SoC designs and mobile devices such as wearables that have displays operating at relatively higher voltage that the SoC underneath.

In an example, an oxide semiconductor of InGaZnO (IGZO) may be used for TFT in display drives. The oxide semiconductor of IGZO can be created using a low-temperature PVD process (<300 C). Since the IGZO Is a wide gap semiconductor (e.g., about 3.3 eV), the IGZO TFT can be used as on-chip bridging I/Os peripherals (e.g. displays, car electronics, etc.) and high functionality CMOS-based SoCs.

However, currently only n-channel transistors can be made with IGZO. P-channel operation cannot be achieved because of the high density of traps known to exist above the valence band edge of IGZO material. These traps are related to "oxygen vacancies" in the IGZO material. What is needed is a system and method that includes a p-channel transistor made with IGZO.

In an example, a process for making a p-channel IGZO TFT can include doping the IGZO with sulfur (or alloying sulfur with IGZO) to raise the valence band edge of IGZO by about 0.5 eV to about 0.7 eV. Raising the valence band can cause the traps near the valence band edge to be inside the valence band and thus allowing p-channel operation. In one implementation, the sulfur concentration is high enough to raise a valence band edge by the desired amount and allow the inversion of IGZO (e.g., an n-type material with typical doping levels of about $10^{12}$ cm$^{-3}$ to about $10^{15}$ cm$^{-3}$). The incorporation of sulfur in ZnO results in higher valence band edge (and fixed conduction band edge) and in some specific examples, was measured as a reduction of the ZnO band gap from about 3.35 eV to about 2.7 eV. In an example, the ZnO sulfur alloy has a band gap of about 2.2 eV to about 2.7 eV. In other examples, materials other than IGZO may be doped or alloyed with sulfur to create a p-channel TFT. For example, one or more members of the zinc oxide family (e.g., gallium zinc oxynitride (GaZnON), gallium zinc oxide (GaZnO), aluminum zinc oxide (AlZnO), indium zinc oxide (InZnO), etc.) may be doped or alloyed with sulfur to create a p-channel TFT. Although a few examples are described, any material that may raise a valence band edge by a desired amount and create a p-channel TFT falls within the spirit and scope of the present disclosure.

A process for making a p-channel IGZO TFT can include co-doping of IGZO with sulfur, tellurium, or cadmium to raise the valence band edge upward by about 0.5 eV to about 0.7 eV and with nitrogen, copper, phosphorus or any other p-type dopant in ZnO or IGZO. This co-doping can result in the formation of a p-type IGZO channel that can be used to form accumulation-mode conduction. The role of the sulfur co-doping is to make the activation energy of "acceptor" doping lower than 100-150 meV so that it will be possible to make a p-type IGZO material with hole concentration in the range of about 1012 cm−3 to about 1015 cm−3. By make a p-channel thin film transistor using IGZO, significant contributions towards designing high voltage CMOS circuits based on n- and p-channel IGZO material fabricated can be achieved at temperatures below about 350 C.

In an example, the incorporation of sulfur in IGZO may be realized by reactive sputtering of IGZO with H2S gas (i.e., in-situ incorporation of sulfur). This is a preferred method since the substrate temperature will not exceed about 350 C. In another example, the incorporation of sulfur in IGZO may be done by doping IGZO with sulfur using solid-source and laser annealing. Laser annealing (with duration in nanoseconds to milliseconds) should be safe for the interconnect metals on which the IGZO TFTs are being fabricated.

Disclosed herein are substrates, assemblies, and techniques for enabling an oxide semiconductor. In an embodiment, an apparatus can include an oxide semiconductor, where the oxide semiconductor includes an IGZO sulfur alloy as a semiconducting material. The semiconducting material can be included in a TFT and the TFT can include one or more p-channels. The sulfur causes a valence band edge of the IGZO to be raised by about 0.3 to about 0.7 eV such that traps near the valence band edge are inside the valence band. In addition, a reduction of the ZnO band gap can be from about 3.35 eV to about 2.7 eV.

Turning to FIG. 1, FIG. 1 illustrates one embodiment of an oxide semiconductor, in accordance with one embodiment of the present disclosure. In an embodiment, an electronic device 102 can include back end of the line (BEOL) transistors 106 and core logic 108. Electronic device 102 can be coupled to a high voltage load 104.

Core logic 108 can include a microcontroller (MCU). The MCU may be a small computer (e.g., SoC) on a single integrated circuit including a processor core, memory, and programmable input/output peripherals. Program memory in the form of Ferroelectric RAM, NOR flash or OTP ROM can also be included on the chip as well as a typically small amount of RAM.

BEOL transistors 106 can include transistors with high Vd, high Vg, and high Ion. In an example, BEOL transistors 106 can include one or more junction gate field-effect transistors (JFET or JUGFET). A JFET is the simplest type of field-effect transistor and include three-terminal semiconductor devices that can be used as electronically-controlled switches, amplifiers, or voltage-controlled resistors. Unlike bipolar transistors, JFETs are exclusively voltage-controlled in that they do not need a biasing current. Electric charge flows through a semiconducting channel between source and drain terminals. By applying a reverse bias voltage to a gate terminal, the channel is "pinched," so that the electric current is impeded or switched off completely. A JFET is usually on when there is no potential difference between its gate and source terminals. If a potential difference of the proper polarity is applied between its gate and source terminals, the JFET will be more resistive to current flow, which means less current would flow in the channel between the source and drain terminals. Thus, JFETs are sometimes referred to as depletion-mode devices.

JFETs can have an n-type or p-type channel. In an example, BEOL transistors 106 can include one or more p-channels 110. Generally, BEOL is the second portion of IC fabrication where individual devices (e.g., transistors, capacitors, resistors, etc.) are interconnected with wiring on a wafer. BEOL generally begins when the first layer of metal is deposited on the wafer and includes contacts, insulating layers (dielectrics), metal levels, and bonding sites for chip-to-package connections.

Figure 1B:
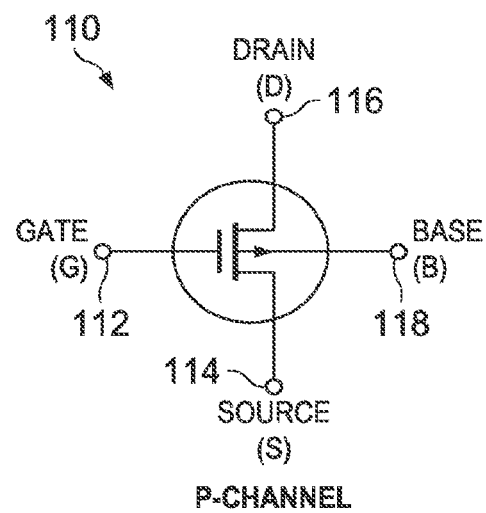
FIG. 1B is a simplified block diagram illustrating an embodiment of a portion of an electronic device, in accordance with one embodiment of the present disclosure.

Turning to FIG. 1B, FIG. 1B illustrates one embodiment of a p-channel 110, in accordance with one embodiment of the present disclosure. P-channel 106 can include a gate 112, a source 114, a drain 116, and a base 118. P-channel 106 may be a p-channel JFET. A p-channel JFET is a JFET whose channel is composed primarily of holes as the charge carrier. This means that when the transistor is turned on, it is primarily the movement of holes which constitutes the current flow. This is in contrast to N-Channel JFETs, whose channel is composed primarily of electrons, which constitute the current flow. P-Channel 110 can include an IGZO sulfur alloy as a semiconducting material.

To turn on a P-channel JFET, a negative voltage VDD can be applied to the drain of the transistor with respect to the source (the source must be sufficiently more negative than the drain (Vs>VD)). This will allow a current to flow through the drain-source channel, if the gate voltage, VGG, is 0V, the drain current is at its largest value for safe operation, and the JFET is in the On condition. To turn off a P-channel JFET, either the bias negative voltage, VDD, that powers the drain, can be cut off or, a positive voltage can be applied to the gate (relative to the source). When a positive voltage is applied to the gate, the drain current is reduced. As the gate voltage, VGG, becomes more positive, the current lessens until cutoff, which is when the JFET is in the Off condition. This stops a large drain-source current.

Figure 2:
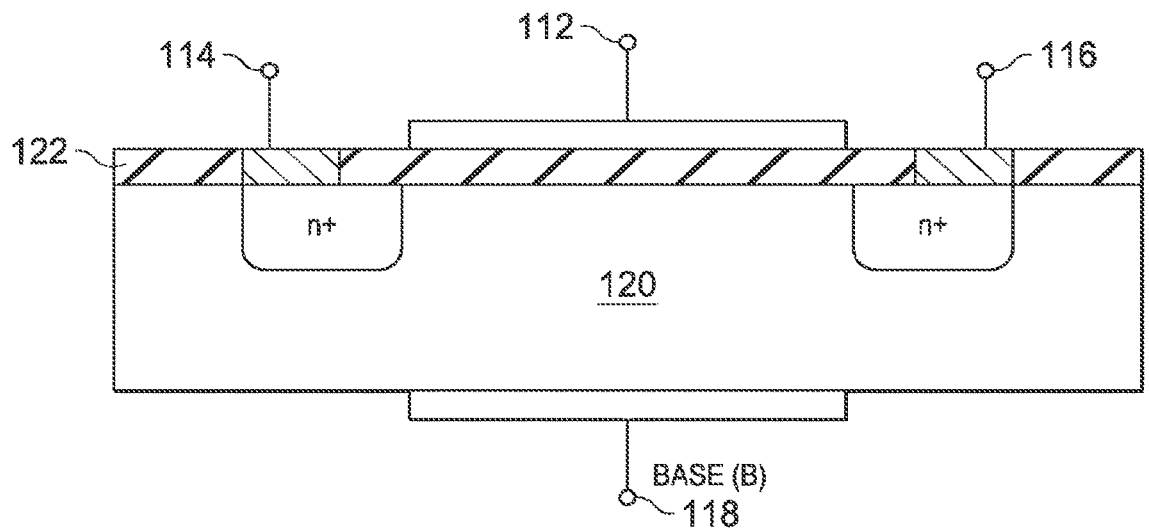
FIG. 2 is a simplified block diagram illustrating an embodiment of a portion of an electronic device, in accordance with one embodiment of the present disclosure.

Turning to FIG. 2, FIG. 2 illustrates one embodiment of a p-type metal-oxide semiconductor FET (MOSFET) 120. P-type MOSFET 120 can include gate 112, source 114, drain 116, and base 118. An oxide layer 122 can include an IGZO sulfur alloy to allow for a p-type IGZO material with hole concentrations in the range of about 1012 cm−3 to about 1015 cm−3.

Figure 3:
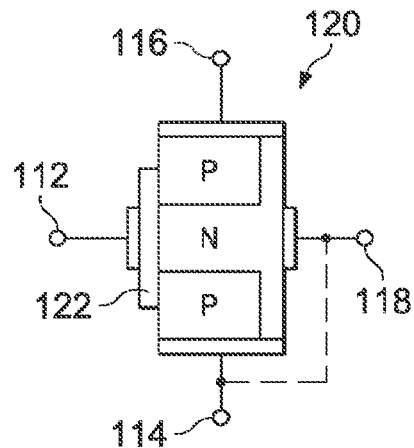
FIG. 3 is a simplified block diagram illustrating an embodiment of a portion of an electronic device, in accordance with one embodiment of the present disclosure.

Turning to FIG. 3, FIG. 3 illustrates one embodiment of a p-channel MOSFET, in accordance with one embodiment of the present disclosure. As illustrated in FIG. 3, p-type MOSFET 120 can include gate 112, source 114, drain 116, and base 118. Oxide layer 122 can include an IGZO sulfur alloy. In an example, base 118 can be used for grounding.

Figure 4A:
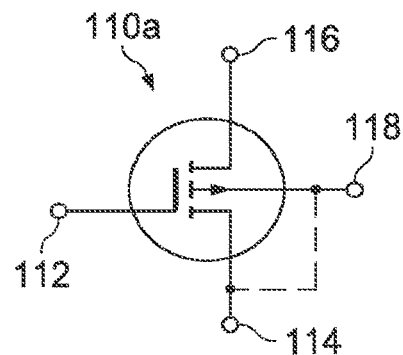
FIG. 4A is a simplified block diagram illustrating an embodiment of a portion of an electronic device, in accordance with one embodiment of the present disclosure.

Turning to FIG. 4A, FIG. 4A illustrates one embodiment of a p-channel 110a, in accordance with one embodiment of the present disclosure. As illustrated in FIG. 4A, p-channel 110a is an enhancement type where the transistor requires a gate-source voltage, (VGS) to switch the device "ON". An enhancement mode MOSFET is equivalent to a "Normally Open" switch.

Figure 4B:
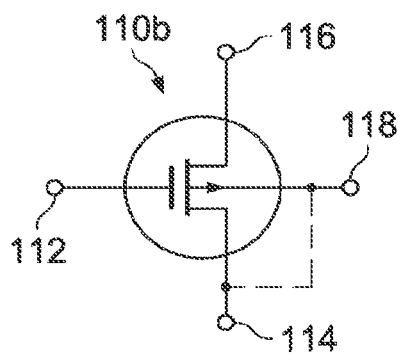
FIG. 4B is a simplified block diagram illustrating an embodiment of a portion of an electronic device, in accordance with one embodiment of the present disclosure.

Turning to FIG. 4B, FIG. 4B illustrates one embodiment of a p-channel 110b, in accordance with one embodiment of the present disclosure. As illustrated in FIG. 4B, p-channel 110b is a depletion type where the transistor requires the VGS to switch the device "OFF". A depletion mode MOSFET is equivalent to a "Normally Closed" switch.

A depletion-mode MOSFET is less common than the enhancement mode types and is normally switched "ON" (conducting) without the application of a gate bias voltage. That is, the channel conducts when VGS=0 making it a "normally-closed" device. A positive gate-source voltage, +VGS applied to a p-channel depletion MOS transistor can deplete the channel of its free holes turning it "OFF". In other words, for a p-channel depletion mode MOSFET, +VGS means less electrons and less current while a −VGS means more electrons and more current.

In an example, a plurality of transistors, such as metal-oxide-semiconductor field-effect transistors (MOSFET or simply MOS transistors), may be fabricated on the substrate. In various embodiments, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that various embodiments may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
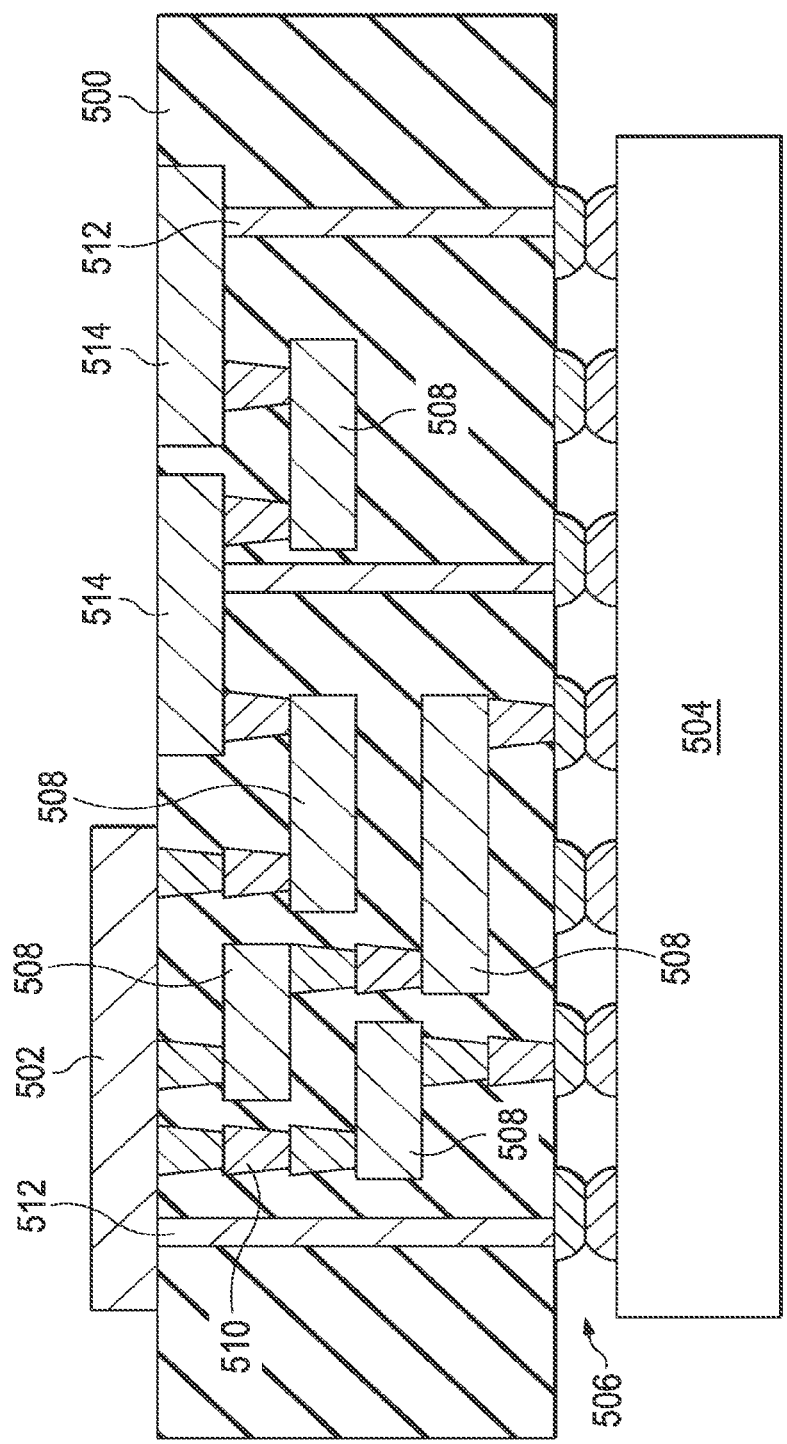
FIG. 5 is an interposer implementing one or more of the embodiments disclosed herein.

Turning to FIG. 5, FIG. 5 illustrates an interposer 500 that can include or interact with one or more embodiments disclosed herein. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 503 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with various embodiments, apparatuses or processes disclosed herein may be used in the fabrication of interposer 500.

Figure 6:
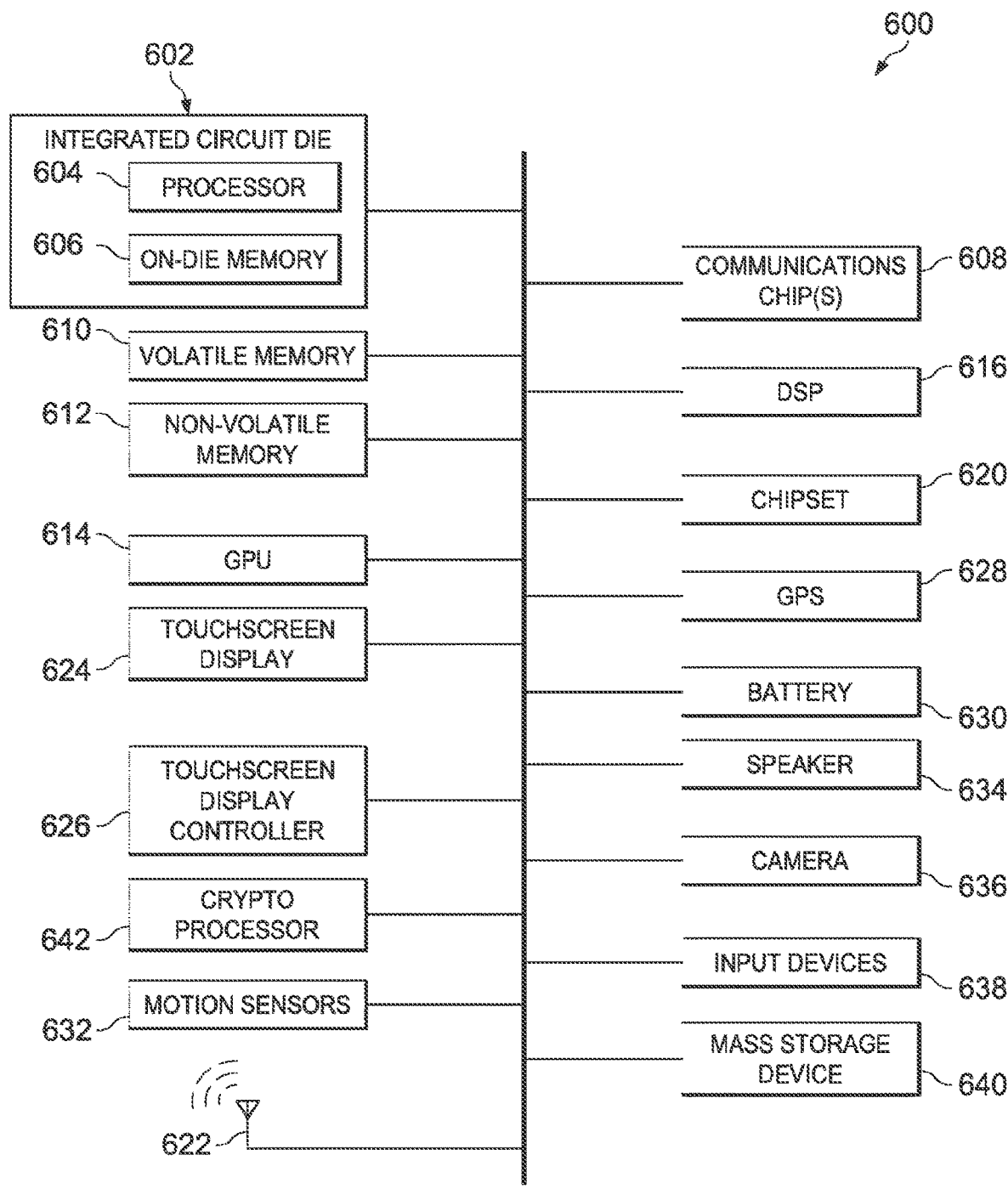
FIG. 6 is a computing device built in accordance with an embodiment disclosed herein.

Turning to FIG. 6, FIG. 6 illustrates a computing device 600 in accordance with various embodiments. The computing device 600 may include a number of components. In one embodiment, these components are attached to one or more motherboards. In an alternate embodiment, some or all of these components are fabricated onto a single system-on-a-chip (SoC) die. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 603 is fabricated in a separate integrated circuit chip that may be bonded to a substrate or motherboard that is shared with or electronically coupled to the integrated circuit die 602. The integrated circuit die 602 may include a CPU 604 as well as on-die memory 606, often used as cache memory, that can be provided by technologies such as embedded DRAM (eDRAM) or spin-transfer torque memory (STTM or STT-MRAM).

Computing device 600 may include other components that may or may not be physically and electrically coupled to the motherboard or fabricated within an SoC die. These other components include, but are not limited to, volatile memory 610 (e.g., DRAM), non-volatile memory 612 (e.g., ROM or flash memory), a graphics processing unit 614 (GPU), a digital signal processor 616, a crypto processor 642 (a specialized processor that executes cryptographic algorithms within hardware), a chipset 620, an antenna 622, a display or a touchscreen display 624, a touchscreen controller 626, a battery 628 or other power source, a power amplifier (not shown), a voltage regulator (not shown), a global positioning system (GPS) device 628, a compass 630, a motion coprocessor or sensors 632 (that may include an accelerometer, a gyroscope, and a compass), a speaker 634, a camera 636, user input devices 638 (such as a keyboard, mouse, stylus, and touchpad), and a mass storage device 640 (such as hard disk drive, compact disk (CD), digital versatile disk (DVD), and so forth).

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi and Bluetooth and a second communications logic unit 608 may be dedicated to longer range wireless communications such as GPS, EDGE, GPRS, CDMA, WIMAX, LTE, Ev-DO, and others.

The processor 604 of the computing device 600 can communicate with one or more devices that are formed in accordance with various embodiments. The term "processor" may refer to any device or portion of a device that processes electronic data from registers and/or memory to transform that electronic data into other electronic data that may be stored in registers and/or memory.

The communications logic unit 608 may also include one or more devices, such as transistors or metal interconnects, that are in communication with various ones of the embodiments disclosed herein.

In various embodiments, the computing device 600 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

The above description of illustrated implementations, including what is described in the Abstract, is not intended to be exhaustive or to limit the scope of the disclosure to the precise forms disclosed. While specific implementations of, and examples for, the embodiments disclosed herein are described herein for illustrative purposes, various equivalent modifications are possible within the scope of the disclosure, as those skilled in the relevant art will recognize.

Other Notes and Examples

Example 1 is an apparatus including an oxide semiconductor, where the oxide semiconductor includes a zinc oxide (ZnO) sulfur alloy as a semiconducting material.

In Example 2, the subject matter of Example 1 can optionally include where the semiconducting material is included in a thin-film-transistor.

In Example 3, the subject matter of any one of Examples 1-2 can optionally include where the thin-film-transistor Includes one or more p-channels.

In Example 4, the subject matter of any one of Examples 1-3 can optionally include where the ZnO sulfur alloy is formed by reactive sputtering or ZnO with H2S gas.

In Example 5, the subject matter of any one of Examples 1-4 can optionally include where traps near the valence band edge are inside the valence band.

In Example 6, the subject matter of any one of Examples 1-5 can optionally include where the sulfur causes a valence band edge of the ZnO to be raised by about 0.5 to about 0.7 eV.

In Example 7, the subject matter of any one of Example 1-6 can optionally include where the ZnO sulfur alloy has a band gap of about 2.2 eV to about 2.7 eV.

In Example 8, an method can include creating an indium gallium zinc oxide (IGZO) sulfur alloy as a semiconducting material and using the IGZO sulfur alloy as a semiconducting material in an oxide semiconductor.

In Example 9, the subject matter of Example 8 can optionally include where the IGZO sulfur alloy was created by reactive sputtering of IGZO with H2S gas.

In Example 10, the subject matter of any one of Examples 8-9 can optionally include where a substrate temperature does not exceed 350 degrees Celsius.

In Example 11, the subject matter of any one of Examples 8-10 can optionally include where creating the IGZO sulfur alloy includes doping IGZO with sulfur using solid-source and laser annealing.

In Example 12, the subject matter of any one of Examples 8-11 can optionally include where the semiconducting material is included in a thin-film-transistor.

In Example 13, the subject matter of any one of Examples 8-12 can optionally include where each of the plurality of devices satisfies a group filter included in the broadcast query.

In Example 14, the subject matter of any one of Examples 8-13 can optionally include where the thin-film-transistor includes one or more p-channels.

In Example 15, the subject matter of any one of Examples 8-14 can optionally include where the sulfur causes a valence band edge of the ZnO to be raised by about 0.5 to about 0.7 Ev.

Example 16 is a computing device including a processor mounted on a substrate, a communications logic unit within the processor, a memory within the processor, a graphics processing unit within the computing device, an antenna within the computing device, a display on the computing device, a battery within the computing device, a power amplifier within the processor, and a voltage regulator within the processor. The processor includes an oxide semiconductor, where the oxide semiconductor includes an indium gallium zinc oxide (IGZO) sulfur alloy as a semiconducting material.

In Example 17, the subject matter of Example 16 can optionally include where the semiconducting material is included in a thin-film-transistor.

In Example 18, the subject matter of any one of the Examples 16-17 can optionally include where the thin-film-transistor includes one or more p-channels.

In Example 19, the subject matter of any one of the Examples 16-18 can optionally include where the oxide semiconductor is fabricated at a temperature below about 350 degrees Celsius.

In Example 20, the subject matter of any one of the Examples M1-M4 can optionally include where the IGZO sulfur alloy is formed by reactive sputtering of IGZO with H2S gas.

Example 21 is an electronic device including a thin-film transistor, where the thin-film transistor includes a zinc oxide (ZnO) sulfur alloy.

In Example 22, the subject matter of Example 21 can optionally include where the thin-film-transistor includes one or more p-channels.

In Example 23, the subject matter of any one of the Examples 21-22 can optionally include where the ZnO sulfur alloy is formed by reactive sputtering of ZnO with H2S gas.

In Example 24, the subject matter of any one of the Examples 21-22 can optionally include where traps near the valence band edge are inside the valence band.

In Example 25, the subject matter of any one of the Examples 21-24 can optionally include where the ZnO sulfur alloy has a band gap less than a band gap of ZnO.

The invention claimed is:

1. An apparatus, comprising:
an oxide semiconductor, including an indium gallium zinc oxide (IGZO) alloyed or doped with sulfur, where the IGZO alloyed or doped with sulfur is a p-type semiconductor material with a hole concentration between $10^{12}$ holes per cubic centimeter ($cm^{-3}$) and $10^{15}$ $cm^{-3}$.

2. The apparatus of claim 1, the apparatus including a thin-film transistor, wherein the oxide semiconductor is a p-channel material of the thin-film transistor.

3. The apparatus of claim 1, wherein the IGZO alloyed or doped with sulfur is formed by reactive sputtering of the IGZO with $H_2S$ gas.

4. The apparatus of claim 1, wherein traps near the valence band edge are inside the valence band.

5. An electronic device, comprising:
a thin-film transistor, wherein the thin-film transistor includes an indium gallium zinc oxide (IGZO) alloyed or doped with sulfur and wherein the IGZO alloyed or doped with sulfur is a p-type semiconductor material with a hole concentration between $10^{12}$ holes per cubic centimeter ($cm^{-3}$) and $10^{15}$ $cm^{-3}$.

6. The electronic device of claim 5, wherein the IGZO alloyed or doped with sulfur is a p-channel material of the thin-film-transistor.

7. The electronic device of claim 5, wherein the IGZO alloyed or doped with sulfur is formed by reactive sputtering of the IGZO with $H_2S$ gas.

8. The apparatus of claim 1, the apparatus including a junction gate field-effect transistor (JFET), where the oxide semiconductor is a p-type channel material of the JFET.

9. The apparatus of claim 8, wherein the JFET further includes a gate, a source, a drain, and a base.

10. The apparatus of claim 1, the apparatus including a metal-oxide semiconductor field-effect transistor (MOSFET), where the oxide semiconductor is included in an oxide layer of the MOSFET.

11. The apparatus of claim 10, wherein the MOSFET further includes a gate, a source, a drain, and a base.

12. The electronic device of claim 5, wherein the thin-film transistor is a junction gate field-effect transistor (JFET), where the IGZO alloyed or doped with sulfur is a p-type channel material of the JFET.

13. The electronic device of claim 12, wherein the JFET further includes a gate, a source, a drain, and a base.

14. The electronic device of claim 5, wherein the thin-film transistor is a metal-oxide semiconductor field-effect transistor (MOSFET), where the IGZO alloyed or doped with sulfur is included in an oxide layer of the MOSFET.

15. The electronic device of claim 14, wherein the MOSFET further includes a gate, a source, a drain, and a base.

16. The electronic device of claim 5, further comprising core logic.

17. The electronic device of claim 5, further comprising a processor core.

18. The electronic device of claim 5, further comprising a memory.

19. The electronic device of claim 5, further comprising input/output peripherals.

20. The electronic device of claim 5, where the electronic device is a computing device that includes a processor, and where the IGZO alloyed or doped with sulfur is included in the processor.

* * * * *

UNITED STATES PATENT AND TRADEMARK OFFICE
CERTIFICATE OF CORRECTION

PATENT NO. : 10,680,115 B2
APPLICATION NO. : 15/772762
DATED : June 9, 2020
INVENTOR(S) : Ahmed et al.

Page 1 of 1

It is certified that error appears in the above-identified patent and that said Letters Patent is hereby corrected as shown below:

On the Title Page

In Column 2, item (57), under "ABSTRACT", Lines 6-7, delete "thin-film-transistor" and insert -- thin-film transistor --, therefor.

In the Specification

In Column 11, Line 6, delete "thin-film-transistor" and insert -- thin-film transistor --, therefor.

In Column 11, Lines 8-9, delete "thin-film-transistor" and insert -- thin-film transistor --, therefor.

In Column 11, Line 22, delete "thin-film-transistor" and insert -- thin-film transistor --, therefor.

In the Claims

In Column 12, Claim 6, Line 3, delete "thin-film-transistor" and insert -- thin-film transistor --, therefor.

Signed and Sealed this
Eighteenth Day of August, 2020

Andrei Iancu
*Director of the United States Patent and Trademark Office*